United States Patent [19]

Chang

[11] Patent Number: 5,255,156
[45] Date of Patent: Oct. 19, 1993

[54] BONDING PAD INTERCONNECTION ON A MULTIPLE CHIP MODULE HAVING MINIMUM CHANNEL WIDTH

[75] Inventor: Kou-Chaun Chang, Renton, Wash.

[73] Assignee: The Boeing Company, Seattle, Wash.

[21] Appl. No.: 756,319

[22] Filed: Sep. 6, 1991

Related U.S. Application Data

[63] Continuation-in-part of Ser. No. 314,817, Feb. 22, 1989.

[51] Int. Cl.$^5$ ............................................. H05K 7/02
[52] U.S. Cl. .................... 361/783; 361/826; 361/764; 361/767; 361/778; 361/813; 174/261; 257/666; 257/690; 257/784
[58] Field of Search ........ 361/380, 395, 397, 400–407, 361/410, 417, 421, 428; 174/261, 260; 357/65, 68, 70; 257/690, 692, 666, 784, 786

[56] References Cited

U.S. PATENT DOCUMENTS

| | | | |
|---|---|---|---|
| 3,603,771 | 9/1971 | Isett et al. | 235/151 |
| 3,653,072 | 3/1972 | Ballas et al. | 444/1 |
| 3,702,004 | 10/1972 | Eskew et al. | 444/1 |
| 4,177,519 | 12/1979 | Kasubuchi et al. | 364/712 |
| 4,259,436 | 3/1981 | Tabuchi et al. | 430/314 |
| 4,567,545 | 1/1986 | Mettler | 361/401 |
| 4,578,697 | 3/1986 | Takemae | 357/75 |
| 4,593,362 | 6/1986 | Bergeron et al. | 364/488 |
| 4,613,940 | 9/1986 | Shenton et al. | 364/490 |
| 4,613,941 | 9/1986 | Smith et al. | 364/490 |
| 4,636,965 | 1/1987 | Smith et al. | 364/491 |
| 4,700,316 | 10/1987 | Nair | 364/488 |
| 4,774,635 | 9/1988 | Greenberg et al. | 361/421 |
| 4,797,787 | 1/1989 | Shimizu | 361/421 |
| 4,887,352 | 12/1989 | Adams | 29/827 |
| 4,903,113 | 2/1990 | Frankeny et al. | 357/70 |

*Primary Examiner*—Leo P. Picard
*Assistant Examiner*—Young S. Whang
*Attorney, Agent, or Firm*—Christensen, O'Connor, Johnson & Kindness

[57] ABSTRACT

Disclosed is a electrical circuit (20) that includes a plurality of integrated circuits (22a, 22b, 22c, 22d). At a distance from the perimeter (30,32) of each integrated circuit are disposed a series of spaced-apart bond pads (28). The integrated circuits are placed on a substrate material (24), such that there exists a plurality of channels (36, 38, 40) between the integrated circuits. Rows and columns of conductive traces are formed on the substrate material. Electrical connections are routed between the bond pads, preferentially using the conductive traces formed in the side channels (36, 38) that lie between the perimeter of an integrated circuit and its associated bond pads. The number of conductive traces routed in central channel (40) is minimized in order to reduce the overall area required for interconnections, thereby maximizing the area available for mounting integrated circuits on the substrate.

7 Claims, 14 Drawing Sheets

BONDING PAD INTERCONNECTION ON A MULTIPLE CHIP MODULE HAVING MINIMUM CHANNEL WIDTH

RELATED APPLICATION

This application is a continuation-in-part of U.S. patent application, Ser. No. 314,817, filed Feb. 22, 1989, the benefit of the filing date of which is hereby claimed under 35 U.S.C. Section 120.

FIELD OF THE INVENTION

The present invention generally relates to electronic circuits including multiple integrated circuits mounted on a common substrate, and in particular, to electrical interconnections between bond pads of the multiple integrated circuits.

BACKGROUND OF THE INVENTION

Printed circuit boards generally include many discrete components, which are interconnected with copper (or other conductive) traces that are photolithographically applied to a substrate on which the components are mounted. The conductive traces are usually defined in at least two layers comprising a plurality of vertical traces in one layer and plurality of horizontal traces in another layer. Electrical signals are conducted between the layers using vias that connect a horizontal trace to a vertical trace through the circuit board. To define a conductive path between two points on the substrate, a computer routing program is normally employed. The program selects portions of the vertical and horizontal conductive traces that will most efficiently (i.e., using the shortest route) provide the required interconnection without interfering with or short circuiting other interconnections that have already been assigned. As necessary, the program lays out "jogged" or "dog-leg" paths to accomplish this goal.

Determining how to interconnect a plurality of integrated circuits (ICs) in a multichip module presents a new level of difficulty. A multichip module is an electronic circuit that includes a number of ICs that are disposed directly on a substrate by wire bonding or tape automated bonding (TAB) techniques. By attaching a plurality of ICs to a common substrate in this manner, higher system performance, lower weight, and smaller size can be achieved than is possible with traditional printed circuit boards on which discrete ICs are mounted. Since the number of interconnections between the ICs in a multichip module often number in the thousands, manual routing of conductive interconnections is virtually impossible. Traditional computer assisted circuit board routing techniques would use the area under the ICs for laying out connection paths; however, in multichip modules, the ICs must be mounted directly onto the substrate to insure good thermal conductivity. Therefore, the underlying area is not available to form layers in which conductive traces can be formed and only the areas between the ICs can be used for routing channels.

The input and output terminals of each IC included in a multichip module are connected by very thin fly wires to conductive bond pads located on the substrate using the wire bonding or tape automated bonding operations. The pads are generally aligned with and spaced apart from each side of an IC. In the past, only the areas between the bond pads of adjacent ICs have been used for routing the conductive traces. The areas between the boundaries of each IC and its associated bond pads (each such area comprising a strip at least 50 mils wide) have not been used for interconnection of the pads and have thus been wasted. Ideally, the conventional (central) routing channel, which comprises the area between the bond pads of adjacent ICs, should be as narrow as possible to allow the maximum number of chips to be mounted on a given size substrate. To designers of multichip modules, the total area of the substrate available for mounting ICs is a very valuable commodity; accordingly, the substantial portion of this total area required for interconnecting the integrated circuits should be minimized. As additional area in the central channel between the bonding pads of adjacent integrated circuits is used for interconnections, less of the total area of the substrate is available for mounting ICs.

Accordingly, it is an object of the present invention to provide a multichip module that includes conductive traces disposed in the side channels, which lie between each integrated circuit and its associated bonding pads, so as to maximize chip density on the module. It is a further object of the invention to provide a multichip module including a minimized central channel width. These and other objects and advantages of the present invention will be apparent from the attached drawings and from the Description of the Preferred Embodiments that follows.

SUMMARY OF THE INVENTION

The present invention comprises a multichip electrical circuit including a substrate material and a plurality of integrated circuits disposed on the substrate. Each integrated circuit has associated with it a plurality of bond pads disposed at a distance about the perimeter of the integrated circuit. A plurality of conductive traces are disposed on the substrate for conducting electrical signals to and from the integrated circuits. At least a portion of the conductive traces are routed in a channel that exists between the perimeter of an integrated circuit and the bond pads associated with the integrated circuit. The multichip electrical circuit further comprises a plurality of pins that conduct signals between an individual bond pad and a conductive trace. The pins have a diameter smaller than the size of a bond pad so that they can be moved horizontally or vertically when the conductive traces are being routed. The area of a channel that lies between the bond pads of adjacent integrated circuits is minimized in order to increase the number of integrated circuits included on the multichip electrical circuit.

Also disclosed is a method of routing a plurality of conductive traces in a multichip electrical circuit, that comprises: aligning a plurality of integrated circuits on a substrate such that there exists a routing channel between the perimeters of the plurality of integrated circuits and a plurality of bond pads disposed on the substrate. The routing channel comprises a first channel that lies between a perimeter of an integrated circuit and a first row of bond pads disposed on the substrate, a second channel that lies between the first row of bond pads and a second row of bond pads associated with an adjacent integrated circuit, and a third channel that lies between the second row of bond pads and a perimeter of the adjacent integrated circuit. A plurality of conductive traces are routed in the first and third channels so as to conduct signals to and from the plurality of integrated circuits, and the area of the second channel is thereby minimized in order to maximize the number of integrated circuits that can be mounted on a given size substrate.

DETAILED DESCRIPTION OF THE PREFERRED EMBODIMENT

Figure 1:
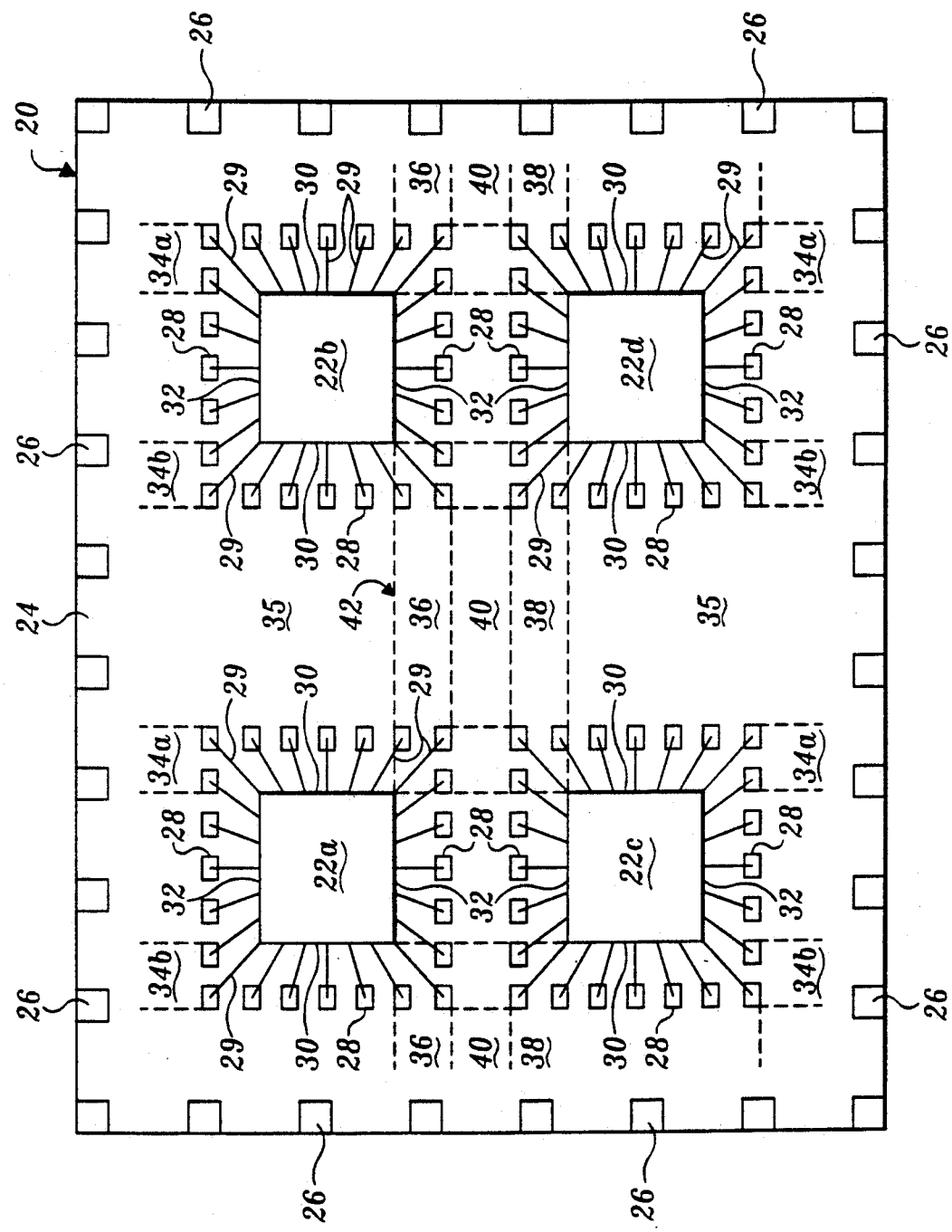
FIG. 1 is a schematic plan view of a substrate for a relatively simple multichip module on which are mounted four ICs that are interconnected in accordance with the present invention.

In FIG. 1, a relatively simplified multichip module 20 is illustrated in which four ICs 22a, 22b, 22c, and 22d are mounted directly on a substrate 24. As noted above in the Background of the Invention, each IC is directly bonded to substrate 24 to improve heat transfer between the IC and the substrate. Consequently, conductive traces usable for interconnection in the multichip module cannot run underneath any IC. Substrate 24 typically comprises a generally planar slab of silicon or gallium arsenide.

Multichip module 20 includes a plurality of edge connections 26, which are spaced apart around the periphery of the multichip module to enable the multichip module to be electrically connected in any electrical circuit (not shown) in which the multichip module is installed. The functions provided by ICs 22a, 22b, 22c, and 22d may be the same or entirely different, depending upon the nature of the ICs and the multichip module. However, the internal operation and construction of ICs 22 are not pertinent to the present invention. Access to the internal circuitry within each IC 22 is provided for interconnection in multichip module 20 by a plurality of spaced-apart pads 28 that surround each IC and are offset from the edges of each of the ICs. A plurality of very fine fly wires extend radially outward from ICs 22 and are bonded to pads 28, thereby providing an electrical path for signals to flow between the pads and the internal circuitry of the ICs.

The edges of each IC 22 are defined as vertical boundaries 30 and horizontal boundaries 32, in respect to the view shown in FIG. 1. It will be apparent that the terms "vertical" and "horizontal" as used herein are relative terms, depending upon how the multichip module is viewed, since rotation of the multichip module through 90 degrees effectively reverses these terms in respect to the observer's view of the multichip module.

As previously discussed in the Background of the Invention, conventional prior multichip modules would only use the areas between pads 28 of adjacent ICs 22 for laying down both horizontal and vertical conductive traces (not shown in FIG. 1) defined within a polymer insulating layer (also not shown) that is applied to substrate 24. Thus, the conventional approach for routing traces on the multichip module would waste the areas between pads 28 and both vertical boundaries 30 and horizontal boundaries 32 of each IC 22. With existing technology, the areas between the pads and the boundaries of the ICs are at least 50 mils wide, and thus constitute a substantial spatial region that is not used in conventional channel routing methods. Space on substrate 24 comprises valuable "real estate," which a designer cannot afford to waste if the number of ICs 22 mounted on the multichip module is to be maximized. Although conventional channel routing techniques can readily be applied to route interconnections through the space between pads 28, such methods are not applicable to using the space between the pads and boundaries 30 and 32 of ICs 22. Described below is a method for routing these interconnections that overcomes this limitation, thereby enabling ICs 22 to be mounted on substrate 24 much more closely spaced apart than would otherwise be possible if conventional channel routing methods were used. The present invention thus minimizes the area between the pads that is required for routing interconnections, and permits higher IC density in a multichip module than the prior art provides.

In accordance with the present invention, multichip module 20 includes a horizontal routing channel 42 and a vertical routing channel 35. Horizontal routing channel 42 comprises a top routing channel 36, which is disposed between pads 28 and lower horizontal boundary 32 of IC 22a and 22b, a central routing channel 40 (within routing channel 42), which would be exclusively used for routing in prior art multichip modules, and a bottom routing channel 38 that is disposed between pads 28 and top horizontal boundary 32 of ICs 22c and 22d. Similarly, vertical routing channel 35 includes side channels 34a and 34b, which are disposed between pads 28 and vertical boundaries 30, on the right and left sides of the ICs.

All connections to pads 28 that are disposed within each horizontal routing channel on the multichip module are routed first. After all of the horizontal channels are routed, the multichip module is logically reoriented so that the previous horizontal routing channels become vertical routing channels, and the previous vertical routing channels become horizontal routing channels. Then, the remainder of interconnections between pads 28 of the ICs comprising the multichip module are routed with respect to the "new" horizontal routing channels.

Those of ordinary skill in the art will appreciate that vertical routing channel 35 and horizontal routing channel 42 comprise at least two layers of orthogonal conductive traces or tracks that are used for interconnecting ICs 22. Additional layers, for example, layers used for power and ground connections, are sometimes also provided, but are not specifically discussed here, in order to simplify this disclosure. The tracks in one layer run vertically, while those in the other layer extend horizontally, using the terms "vertically" and "horizontally" in the context discussed above. Signals and power are conveyed between the layers at vias disposed where a vertical track and a horizontal track are electrically linked together. The horizontal and vertical tracks extend through points referred to as "pins." Since pads 28 are physically larger in size (typically greater than 2 mils on a side) than the distance between adjacent vertical or horizontal tracks, each pin represents an electrical connection point within one of the pads 28 that can be shifted to different horizontal or vertical tracks that lie underneath the pad.

As shown in the view of the crossover region of vertical routing channel 35 and horizontal routing channel 42 (FIG. 2), the pins through which the vertical and horizontal tracks extend are divided into three types. Internal pins 44 are disposed generally between adjacent ICs 22a and 22c, and between adjacent ICs 22b and 22d, spaced apart horizontally within horizontal routing channel 42. Each internal pin 44 is associated with one of the pads 28. Top routing channel 36 extends between lower boundary 32 of ICs 22a and 22b and the adjacent internal pins 44. Similarly, bottom routing channel 38 extends between the top horizontal boundary 32 of ICs 22c and 22d and their associated adjacent internal pins 44.

Figure 2:
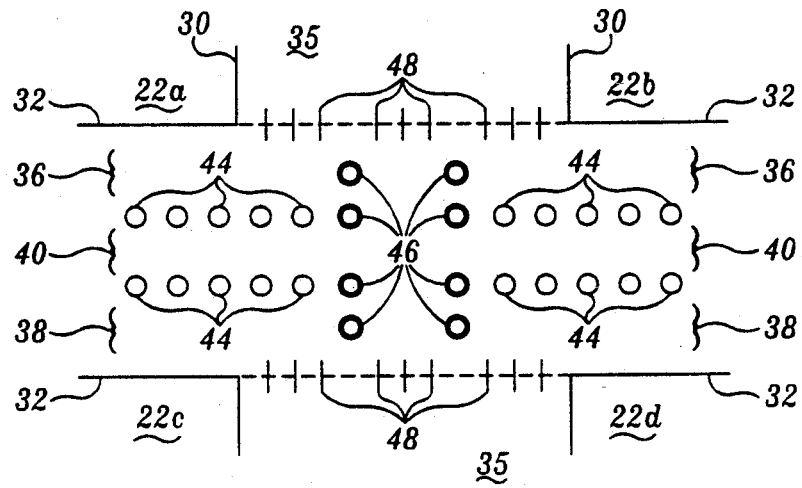
FIG. 2 schematically illustrates a portion of a horizontal routing channel and a crossover area in respect to a vertical routing channel on the multichip module shown in FIG. 1.

The second type of pins shown in FIG. 2 are vertical pins 46, which are spaced apart vertically within vertical routing channel 35 (i.e., in the crossover region), and which are each electrically connected to one of the pads 28 that are vertically aligned within vertical routing channel 35.

Boundary pins 48 (represented by vertical line segments in FIG. 2) are disposed generally in alignment with horizontal boundaries 32 of ICs 22, but are spaced apart across vertical routing channel 35, each one lying on a vertical track within the span of vertical routing channel 35.

The size of top routing channel 36 and bottom routing channel 38, in terms of the number of horizontal tracks that are defined therein is generally fixed, based upon the minimum offset between the boundaries of ICs 22 and pads 28. However, the size (measured vertically) of central routing channel 40 and therefore the number of horizontal tracks that can be formed therein, is variable. The present invention enables the number of horizontal tracks in central routing channel 40 to be minimized by using top routing channel 36 and bottom routing channel 38 for interconnecting internal pins 44 and vertical pins 46. Each horizontal or vertical track requires approximately 1 mil of space (measured transversely to the track), which corresponds to the routing pitch, i.e., the sum of the track width and a minimum distance between two adjacent tracks. The present invention minimizes the size of central routing channel 40 by initially assigning only a limited number of horizontal tracks to it, and thereafter making optimum use of top routing channel 36 and bottom routing channel 38 for interconnecting internal pins 44 and vertical pins 46.

Figure 12:
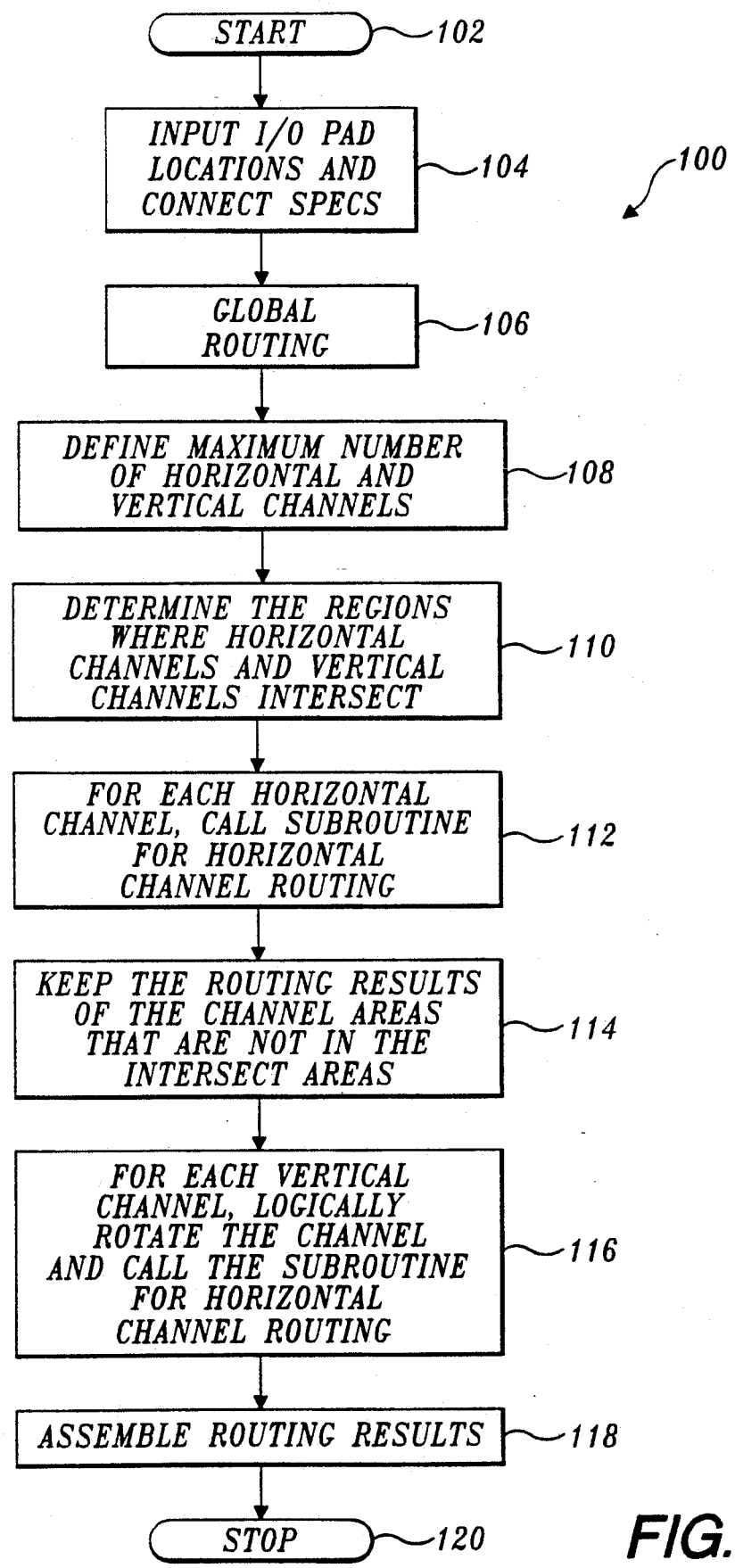
FIG. 12 is a flow chart of a program for routing the conductive traces to create a circuit board according to the present invention.

Turning now to FIG. 12, a flow chart illustrates a main routine for routing interconnects to create a multichip module that provides conductive traces within the side routing channels, e.g., within top routing channel 36 and bottom routing channel 38. Main routine 100 begins at a start block 102. Following start block 102, a block 104 provides for the loading of input/output (I/O) pad locations, which are defined in terms of their coordinates on substrate 24, and data defining the pads that are to be interconnected in nets. For purposes of this specification, a net comprises all of the pins that are to be interconnected in common.

In a block 106, a conventional global routing technique is applied to determine which horizontal and vertical routing channels will be used to interconnect specific pins in each net in the shortest route possible. A block 108 then provides for determining the total number of horizontal and vertical routing channels to be routed. In a block 110, main routine 100 determines crossover regions where the horizontal and vertical routing channels intersect.

A block 112 calls a subroutine for horizontal channel routing, for each horizontal routing channel. After nets in all of the horizontal routing channels have been routed by successive passes through the subroutine, a block 114 insures that the tracks assigned by the routing process are retained for the portions of each horizontal routing channel that are not in a crossover region; however, track assignments in the crossover regions can be changed during routing of interconnections in the current vertical routing channels. A block 116 logically rotates the channels, i.e., logically rotates multichip module 20, so that the horizontal routing channels now become vertical routing channels, and the vertical routing channels now become horizontal routing channels. After the logical rotation in block 116, the subroutine for horizontal channel routing is again called, and each of the previously vertical routing channels are now processed as horizontal routing channels. After the last routing channel has thus been routed, a block 118 provides for assembling the routing results for the overall multichip module by compiling the routing data for the original horizontal routing channels and the results from processing the previous vertical routing channels as horizontal routing channels. Main routine 100 terminates at a block 120.

The majority of the steps carried out in implementing the routing method performed in a channel routing subroutine 130 are shown in FIGS. 13, 13A, 13B and 13C. The subroutine begins at a start block 132, which is followed by a block 134 in which all variables are initialized. The subroutine specifically deals with routing internal pins 44 and vertical pins 46 (as shown in FIG. 2) within a single routing channel such as horizontal routing channel 42. In a block 136, each net of electrically interconnected pins within the horizontal routing channel, comprising N pins in total, are split into N-1, two-pin subnets using the minimum spanning tree algorithm, which is well known to those of ordinary skill in this art. The "Manhattan" distance between the two pins comprising each subnet is then determined, i.e., the sum of the horizontal and vertical distances between the two pins is determined.

Figure 3:
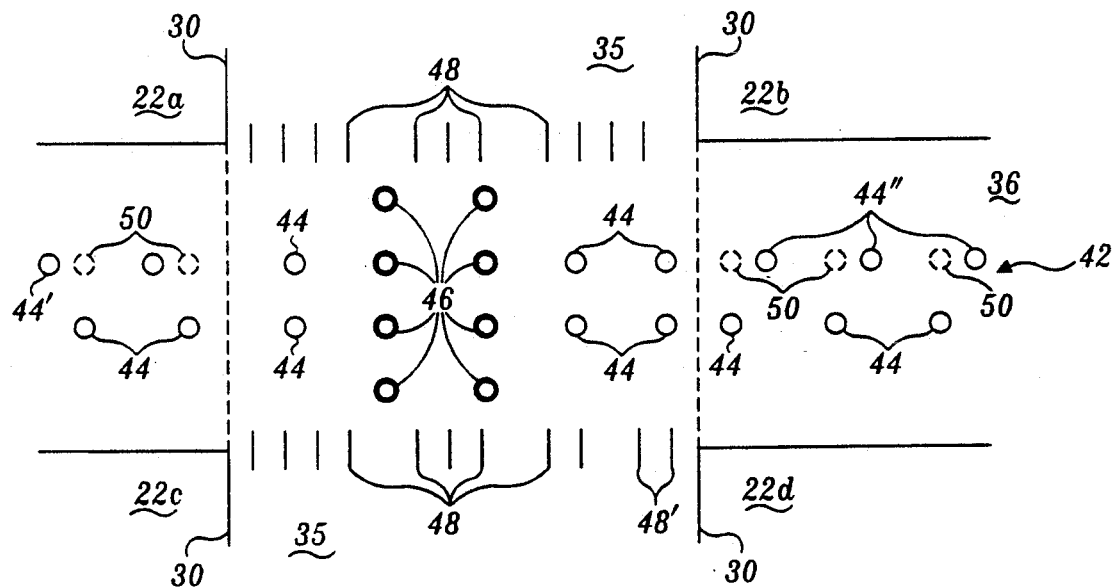
FIG. 3 schematically illustrates how internal pins that are outside a span of top and bottom boundary pins within the horizontal routing channel of FIG. 2 are shifted left or right to improve access for routing connections to the pins.

In a block 146, a series of iterative loops are initiated that operate on the internal pins in each vertical track within the channel being routed. Each of these loops includes a determination in a decision block 148 of whether the internal pins in a given vertical track are in the same net. If not, a block 150 provides for shifting the top internal pin left or right. Thereafter, the logic returns to repeat the loop initiated in block 146 for the next internal pin in a vertical track. Block 146 specifically excludes internal pins that lie within the span of boundary pins 48 (between vertical boundaries 30) within vertical routing channel 35, as represented by internal pins 44 that are between the two vertical dash lines in FIG. 3. As indicated in FIG. 3, internal pins 44 lying within the crossing of vertical routing channel 35 and horizontal routing channel 42 are not shifted left or right even if not in the same net. However, internal pins 44', which are outside the span of vertical channel 35 are shifted left out of alignment with pins 44. Dashed circles 50 represent the previous aligned positions of pins 44 prior to their being shifted left. Similarly, pins 44'' are shifted right, from positions of previous alignment 50 in respect to corresponding pins 44, which are not in the same net. Even though pins 44' and 44'' are respectively shifted left and right in respect to their previous positions 50, they are still contiguous with and in electrical contact with the same pads 28, since pads 28 are sufficiently large in size to encompass different dispositions of the internal pins. By shifting internal pins 44' and 44'' left and right by one track, respectively, these pins can be more readily accessed by vertical tracks that do not interfere with connections to other internal pins 44.

Figure 4:
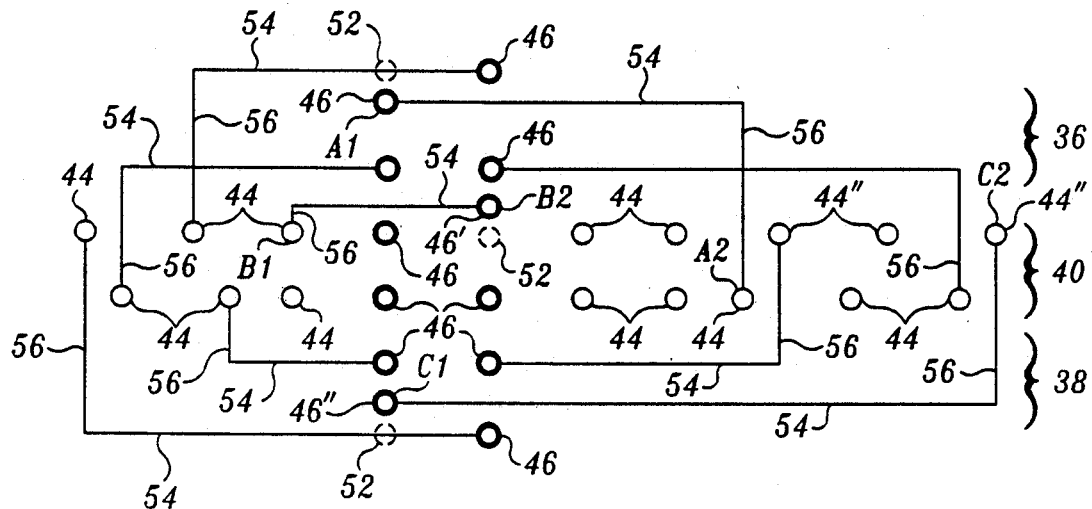
FIG. 4 schematically illustrates the shifting of vertical pins up or down in respect to the crossover section of the horizontal routing channel shown in FIG. 2.

If the internal pins in any vertical track are in the same net, none of the internal pins are shifted; in a block 152, the loop moves to the next vertical track within the routing channel being processed and repeats the loop initiated in block 146. After all vertical tracks in the routing channel are considered, the logic proceeds with a block 154. In block 154, another repetitive loop is initiated that successively checks each vertical pin disposed within the crossover region of vertical routing channel 35 and horizontal routing channel 42. Specifically, in a decision block 156, a determination is made as to whether each subnet connected to a top or bottom vertical pin is also connected to another pin in the same horizontal track as that top or bottom vertical pin. If so, decision block 156 branches to a block 158 which provides for shifting the top or bottom vertical pin up or down one horizontal track, so that it is closer to the center of top routing channel 36 (in the case of a vertical pin within the top routing channel), or closer to the center of bottom routing channel 38 (in the case of a vertical pin within the bottom routing channel). The step implemented in block 158 is illustrated in FIG. 4, wherein, for simplicity, the horizontal and vertical boundaries of ICs 22 have been omitted. In FIG. 4, a vertical pin 46' is shown shifted downwardly toward the center of top routing channel 36, from its previous position, as indicated by a dashed circle 52, which was in alignment with another vertical pin 46. Another pin 46' is shifted upwardly toward the center of the top routing channel.

Horizontal tracks 54 and vertical tracks 56 are illustrated in FIG. 4 to show how each of the vertical pins 46 and 46' might be connected to corresponding internal pins 44 and 44' following the shift of vertical pins implemented in block 158. Similarly, vertical pins 46'' are shown, which have been shifted upwardly toward the center of bottom routing channel 38 from a previous position 52 in alignment with another vertical pin 46. At the top of FIG. 4, one vertical pin 46 is connected, for example, to one of the internal pins 44 by a horizontal track 54 and a vertical track 56. In this Figure, it should be apparent that as a result of its being shifted vertically, a pin 46' designated A1 is thus more readily connected to the internal pin 44 designated A2, thereby avoiding interference with the horizontal track connecting the two other pins. Similarly, one of the internal pins 44 designated B1 is more readily connected using vertical track 56 and horizontal track 54 to shifted vertical pin 46', designated B2, without passing through another unrelated vertical pin. Likewise, a vertical pin 46'' which is designated C1 is more readily connected to an internal pin 44'', designated C2 by being shifted vertically upward. In each case, by shifting these vertical pins upwardly or downwardly (and the internal pins left or right), interference with the connection of other internal or vertical pins not in the same net is avoided. Shifting vertical pins 46' and 46'' upwardly or downwardly by a small incremental amount does not alter their connection to the pads 28 to which they previously were connected, due to the relatively large area of the pad.

If two vertical pins lying in the same horizontal track are in the same net, they are not shifted vertically upwardly or downwardly. In a block 160, the next vertical pin within the horizontal track under consideration is selected before iteratively repeating the loop initiated by block 154. Finally, after all vertical pins have been thus checked and shifted as appropriate, channel routing subroutine 130 proceeds to a block 162, shown in FIG. 13A.

In block 162, a vertical constraint graph G(V,E) is developed that defines the relative order of horizontal tracks 54 for each subnet within the routing channel under consideration, where V represents the set of all subnets having a pin within the routing channel being processed, and E is the set of directed edges. An edge (V1, V2) is in set E if a subnet V1 has a pin that is vertically above a pin of subnet V2 and there is no other pin between them. The constraint (V1, V2) defines the relative sequential order for the horizontal track used by subnet V1 and that used by subnet V2, indicating that, spatially, the horizontal track for subnet V1 is vertically above the horizontal track for subnet V2. Thus constraint graph G(V,E) defines the relative order of horizontal tracks assigned to corresponding subnets. In developing the constraint graph, the horizontal tracks for boundary pins and internal pins are considered first. It is quite possible that constraint graph G(V,E) contains cycles in the ordering of the horizontal tracks, so that the order cannot be defined without violating a constraint. Such cycles are broken by choosing not to consider the vertical constraint in respect to tracks with the lowest "cost." The cost of a vertical track is the sum of the numbers of pins in the left or right immediately adjacent vertical tracks. A lower cost associated with a vertical track means that the pins in that vertical track can be connected easily (i.e., without interference) with those in a neighboring adjacent vertical track. After the constraints for horizontal tracks associated with the internal and boundary pins are determined, constraints for horizontal tracks associated with the vertical pins are added to constraint graph G(V,E), so long as they do not introduce cycles.

Figure 5:
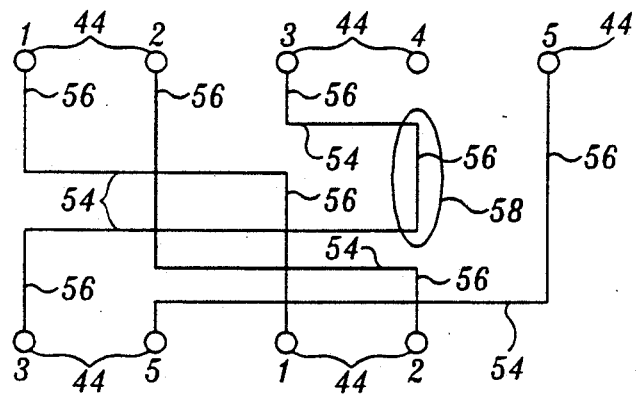
FIG. 5 schematically illustrates an unused vertical track (that extends through an internal pin not requiring interconnection), which facilitates connection of other internal pins.

FIG. 5 illustrates a plurality of internal pins 44 that are interconnected with vertical tracks 56 and horizontal tracks 54. These internal pins are in subnets designated 1 through 5, in sequential order from left to right along the top of FIG. 5, and are connected as correspondingly numbered (in regard to the subnets) internal pins 44, which are shown at the bottom of the Figure. There is no pin in use at the subnet position designated by 4. In developing a constraint graph for this simplistic example, the sequential order of the four subnets would be: 1, 2, 5, 3, cycling back to 1. To break the cycle, an adjacent vertical track lying under position 4 is used. The vertical track through position 4 has the lowest cost, since it is not in use. Accordingly, the number of pins on that vertical track through position 4 is one, compared to the two pins along the vertical track running through subnet position 2, at the other immediately adjacent vertical track. The cycle is thus broken by connecting subnet 3 with a jog over to the vertical track through the adjacent neighboring vertical track having the lowest cost, i.e., the vertical track through position 4.

Referring back to FIG. 13A, in a block 164, the method provides for assigning two numbers to each subnet. The first number, FROM_THE_TOP corresponds to the number of levels from the top of the constraint graph of the horizontal track for that subnet. Similarly, the value FROM_THE_BOTTOM corresponds to the number of levels of the horizontal track associated with a subnet, counting from the bottom of the constraint graph. Another value, TOTAL_LEVEL represents the total number of levels in the constraint graph. These values are used in subsequent steps.

In a block 166, the type designation of each subnet is defined according to the following rules: a boundary pin 46, which is disposed at the top of the crossover region of horizontal routing channel 42 and vertical routing channel 35 is assigned a type number 11; top vertical pins are assigned a type number 12; top internal pins are assigned a type number 13; bottom internal pins are assigned a type number 21; bottom vertical pins are assigned a type number 22; bottom boundary pins (within the crossover region of the horizontal and vertical routing channels) are assigned a type number 23; left boundary pins (within vertical side channel 34a) are assigned a type number 1; and right boundary pins (within vertical side channels 34b) are assigned a type number 2. Thus, each subnet within the horizontal routing channel has associated with it a subnet type that depends upon the type number of the two pins comprising the subnet. To develop the subnet type, the first pin type is multiplied by 100 and the result is added to the second pin type. For example, a subnet type 1122 includes a first top boundary pin and a second bottom vertical pin, i.e., $(11 \times 100) + 22$.

In a block 168, a BEST_TRACK is determined for each subnet, corresponding to the best or preferred horizontal track for that subnet. In this respect, each of the horizontal tracks are numbered, starting at 1 on the bottom of the horizontal routing channel, and ranging to a maximum (equal to NUM_TRACKS) at the top of the horizontal routing channel. The BEST_TRACK is assigned to each subnet, based upon its type, according to the following rules:

(1) subnet type 1111—since this type subnet has both pins disposed at the top boundary, its BEST_TRACK value is set to the horizontal track extending through the top boundary, which is equal to NUM_TRACKS;

(2) subnet type 2323—since this type of subnet has both pins at the bottom boundary, its BEST_TRACK value is set to 1, corresponding to the horizontal track extending through or adjacent to the bottom boundary pins;

(3) subnet type 1313—in this type subnet, both pins are top internal pins, and accordingly, BEST_TRACK is set to a horizontal track that extends through one of the two pins comprising the subnet;

(4) subnet type 2121—in this type subnet, both pins are bottom internal pins and BEST_TRACK is set to the horizontal track running through at least one of the two internal pins 44 comprising the subnet;

(5) subnet types XX12, 12XX, XX22, and 22XX—each of these type subnets has at least one vertical pin, and BEST_TRACK is set to the horizontal track in which that vertical pin is disposed; however, if both pins are vertical tracks, BEST_TRACK is set to the horizontal track of the vertical pin that is closest to the middle of either the top routing channel or the bottom routing channel;

(6) subnet of any other type—BEST_TRACK is set such that: BEST_TRACK = TOTAL_NUM_TRACKS (TOTAL_LEVEL_FROM_THE_TOP)/TOTAL_LEVEL. Eq.(1)

In the above Equation (1), the value for BEST_TRACK is thus determined based upon the relative position of the subnet within the constraint graph, expressed as a fraction of the total number of tracks available.

Once BEST_TRACK is determined according to the above rules, in a block 170, the BEST_TRACK value is assigned to each subnet. This value is used in further defining the horizontal tracks used for interconnecting the two pins comprising each subnet as explained below.

In a block 172, each element of a matrix defining the COST (I,J) for each subnet I in respect to each track J is initialized to zero. The rows of the matrix correspond to the available subnets that must be routed and the columns of the matrix correspond to the various horizontal tracks within the routing channel being processed. Then, in a block 174, for each subnet S, the element of the matrix COST (S, BEST_TRACK) is set to an arbitrary integer LOW. In the preferred form of this method, LOW is set equal to one. (Similarly, other arbitrary values are defined, for use as noted below, including MED equal 80, HIGH equal 6400, and INFINITE equal $2^{16}$). The purpose of block 174 is to ensure that each element of the cost matrix corresponding to the track determined to be the BEST_TRACK for a given subnet is initially set to an arbitrarily low value, indicating that for that subnet, the track designated BEST_TRACK is preferred. Accordingly, in a decision block 176, for any track that is not designated as the BEST_TRACK with respect to a subnet S, the element COST (S,T) is assigned the value LOW plus the absolute value of |T-BEST_TRACK|. However, if the track in question in the COST matrix is designated as the BEST_TRACK, an inquiry block 180 determines if the track T includes a pin or any other blockage in the horizontal span of subnet S. In the event that such a blockage exists, COST (S,T) is set equal to its previous value plus the variable HIGH. Thereafter (or otherwise, immediately following decision block 180), a decision block 184 determines if track T is outside of the access range of a pin in subnet S. The access range of a pin is defined as a set of continuous horizontal tracks bounded by (T,B) such that the pin can be connected with a vertical track to any horizontal track K if $T \geq K \geq B$, without shorting to another subnet. Assuming that the track is outside the access range, a block 186 sets COST (S,T) equal to the previous value of that element of the matrix plus the variable MED, which is arbitrarily defined to provide a medium cost associated with that element. Thereafter (or immediately following a negative result to the inquiry in block 184), the subroutine proceeds with a block 188 that determines:

$$\sum_{J=1}^{NUM\_TRACKS} COST(S, J)$$

for all tracks, and for each subnet S. Block 188 thus provides for determining the sum of all costs associated with the tracks in each row (subnet) of the COST matrix.

In a block 190, all of the subnets in the routing channel being processed are divided into a first set that includes a vertical pin and a second set that does not. Thereafter, in a block 192, the set of subnets that includes a vertical pin is selected; and in a decision block 194, a determination is made as to whether the pins comprising a subnet in that set can be connected with a vertical track. If so, the logic proceeds to a block 196. In block 196, starting with subnet having the largest total $\Sigma$ COST (S,J), the subnet is assigned to a track T, such that the COST (S,T) is a minimum among COST (S,J), for J=1, NUM_TRACKS. In other words, subnet S is assigned to a horizontal track T that has the lowest cost. The same logic is applied in assigning horizontal tracks to each of the other subnets, working toward the subnets with successively smaller total $\Sigma$ COSTS (S,J).

In a decision block 198, a determination is made as to whether any subnet R is in the same net as a subnet S, and if so, in a block 200, COST (R,T) is set equal to the previous COST (R,T) minus SUB (where SUB is a predefined variable having a value 5 in the preferred form of this method). This adjustment to COST (R,T) encourages subnet R to be assigned to horizontal track T, which saves a via, since subnets S and R then can share a pin, being in the same net.

In respect to decision block 194, if the two pins comprising a subnet cannot be connected with a vertical track, a decision block 202 determines if a vertical pin in the subnet can be connected to a horizontal track T. If so, the logic proceeds to block 200, which was described above. Otherwise, a decision block 204 determines if a subnet R is in the same net as subnet S. This inquiry is analogous to decision block 198. If the answer to the inquiry is affirmative, the logic again proceeds to block 200. Otherwise, a block 206 assigns a value COST (R,V) equal to the previous value of COST (R,V) plus MED, where MED is the arbitrary value noted above, and V is a horizontal track that runs through the vertical pin comprising the subnet. The step in block 206 thus biases the cost associated with a subnet comprising a vertical pin that cannot be connected to track T, by adding the arbitrary value MED to the previous cost for that subnet (for any subnet R in respect to a horizontal track V on which the vertical pin in subnet R resides), if subnet R is not in the same net as subnet S. By providing this biasing value to the cost of subnet R, a conventional maze routing technique that may subsequently be applied is more likely to make an interconnection between the pins comprising the subnet, since other subnets are forced to use tracks other than V, so that the vertical pin comprising subnet R can later be connected with track V.

Following decision block 206 (or after a negative result from decision block 198), the logic proceeds to a decision block 208. In this decision block, a determination is made as to whether the span of subnet S overlaps the span of subnet R. An affirmative response to this inquiry implies that subnet S and subnet R, which are not of the same net, overlap and therefore are shorted—a condition that cannot be allowed. Accordingly, block 210 sets the value for COST (R,T) equal to INFINITE. Block 210 thus effectively deletes subnet R from the set, since the value of INFINITE is so large that track T will never be assigned to subnet R.

Following block 210 (or immediately following a negative result from decision block 208), a decision block 212 determines whether all subnets in the set with a vertical pin have been considered. If not, a block 215 selects the next such subnet and returns to decision block 194. As the logic again loops down through block 196, subnets with a successively smaller total cost (S,J) are considered, until all subnets in the set of subnets with a vertical pin have been considered. Thereafter, an affirmative result to decision block 212 leads to an inquiry in a decision block 214 that determines if all subnets in the set without a vertical pin have been considered. Since, initially, none of the subnets in this set have yet been considered, the subroutine proceeds with a block 216 that selects the set of subnets without a vertical pin and again, repetitively loops through block 196 and each of the subsequent blocks discussed above.

Figure 13:
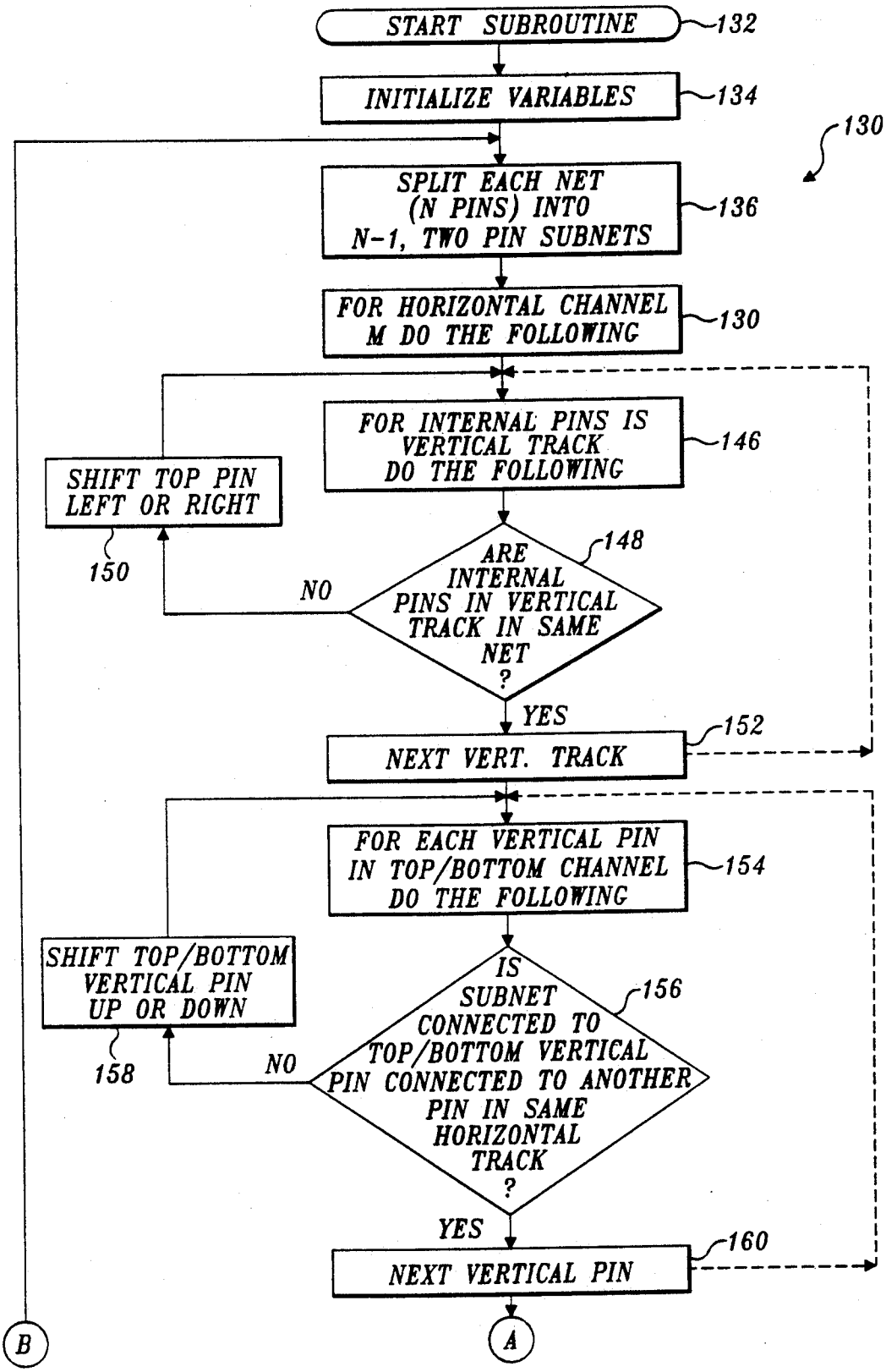
FIGS. 13 and 13A through 13C are portions of a flow chart showing a circuit board according to the conductive traces to create in accordance with the present invention.
Figure 13A:
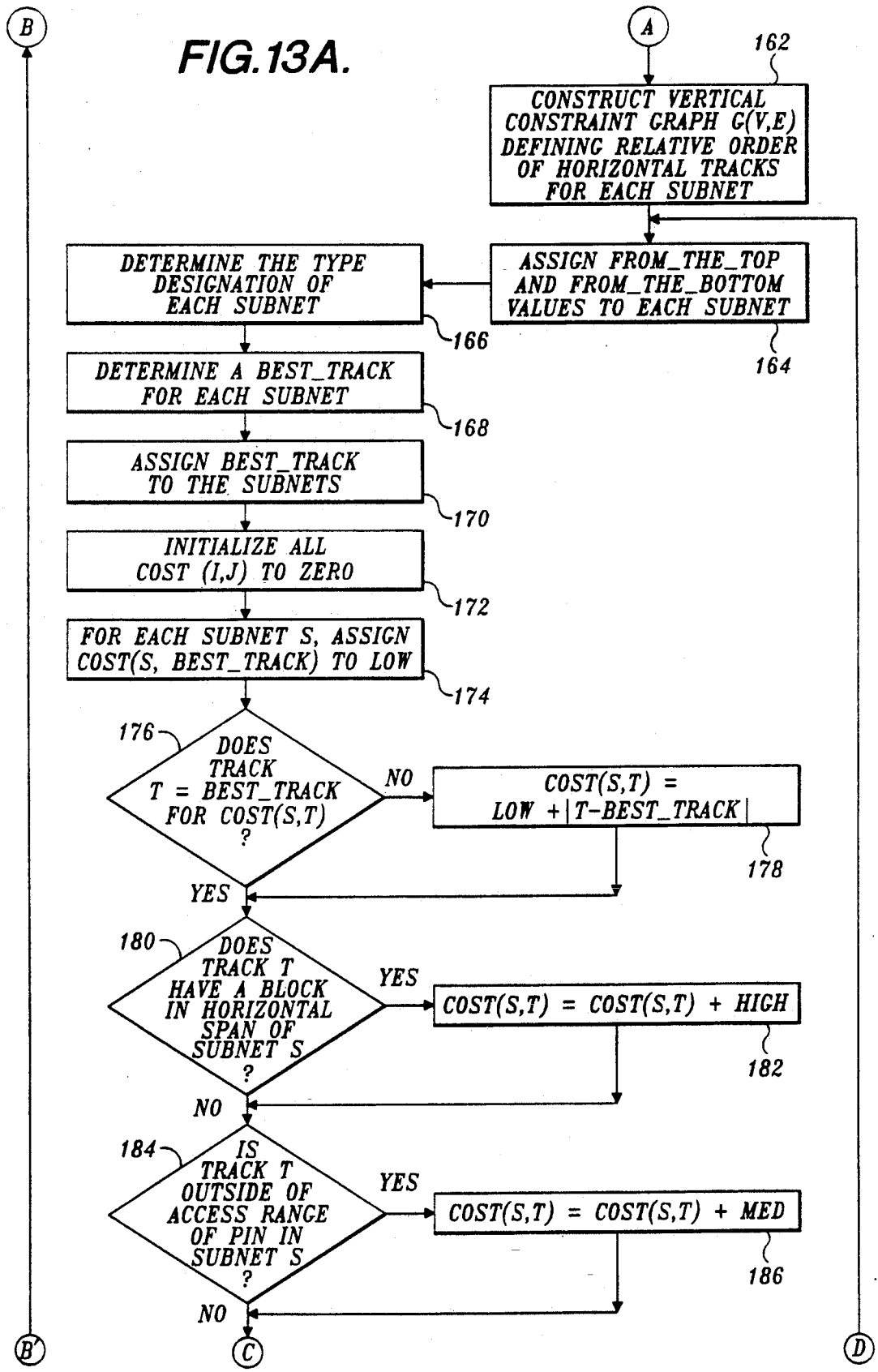
Figure 13B:
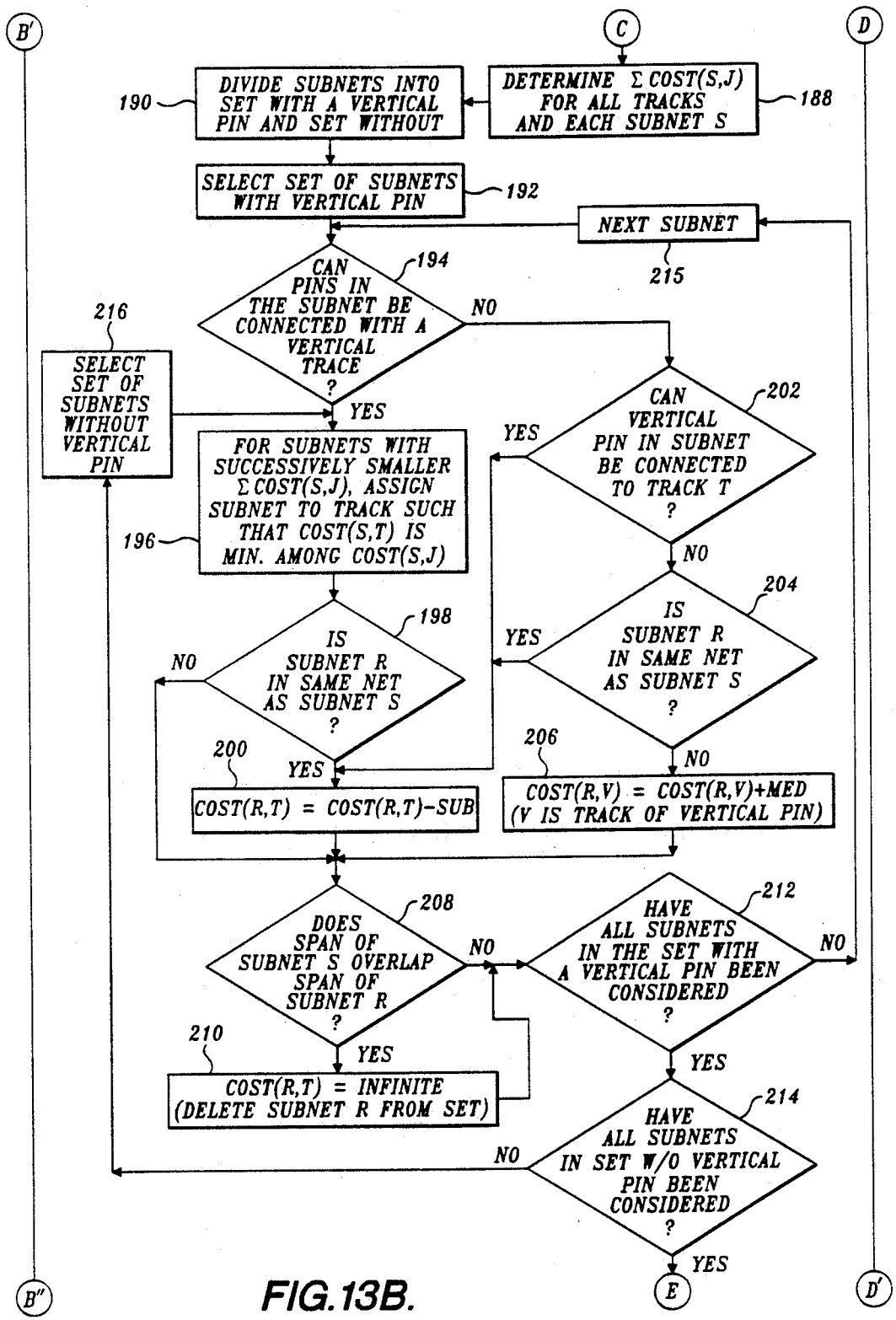
Figure 13C:
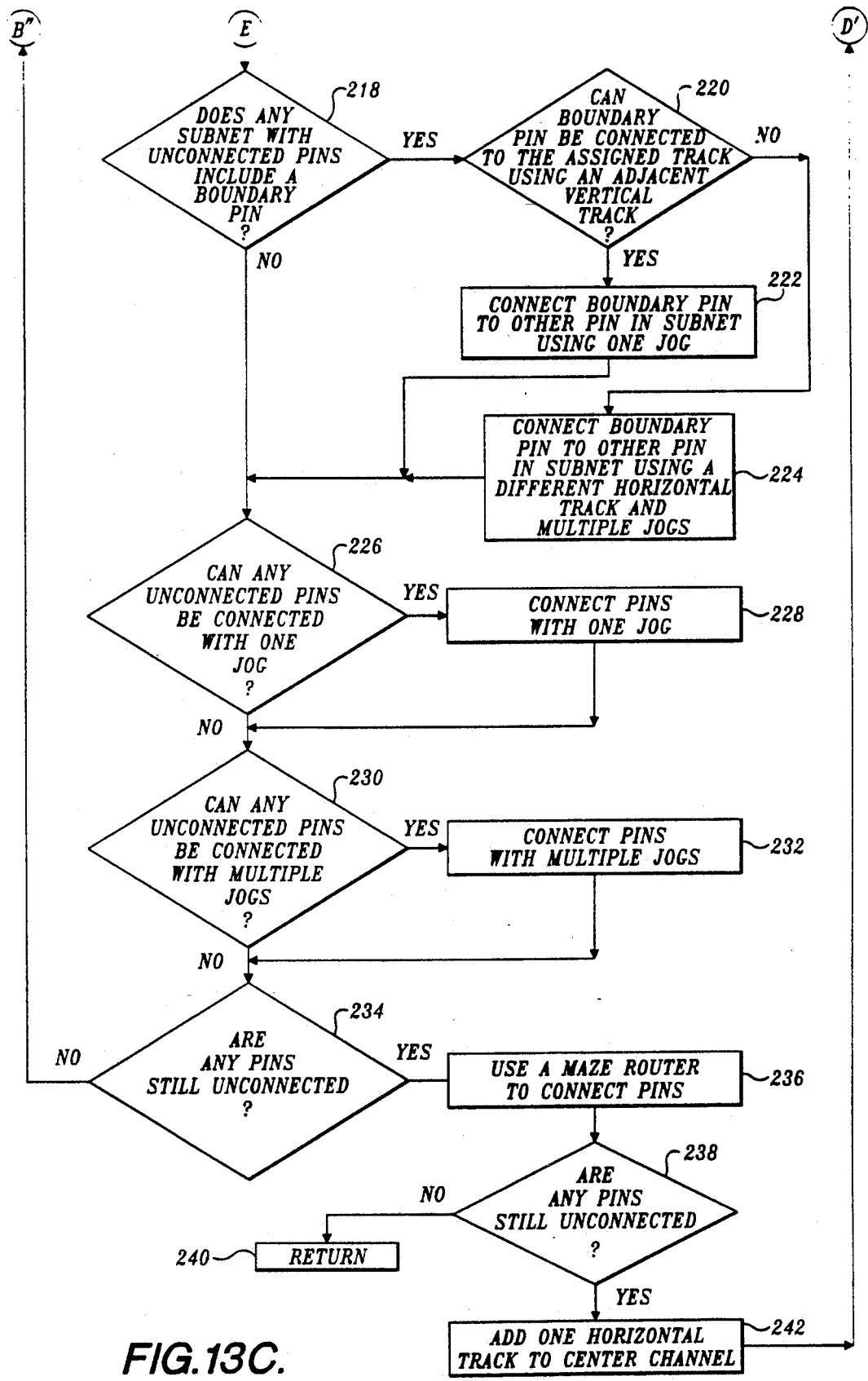

Finally, when all subnets without a vertical pin have been evaluated, the subroutine proceeds with a decision block 218 as shown in FIG. 13C. In this decision block, an inquiry determines whether any subnet that includes a boundary pin remains with unconnected pins. If so, a decision block 220 determines whether the boundary pin can be connected to an assigned track T using an adjacent vertical track. For example, assume subnet S is the unconnected subnet comprising an unconnected pin A1. Further, assume track T is the horizontal track where pin A1 resides, column P is the vertical track where pin A1 resides, and subnet S uses track T. A path using one jog or dogleg, generally as shown in FIG. 6, can connect pin A1 to track T.

Figure 6:
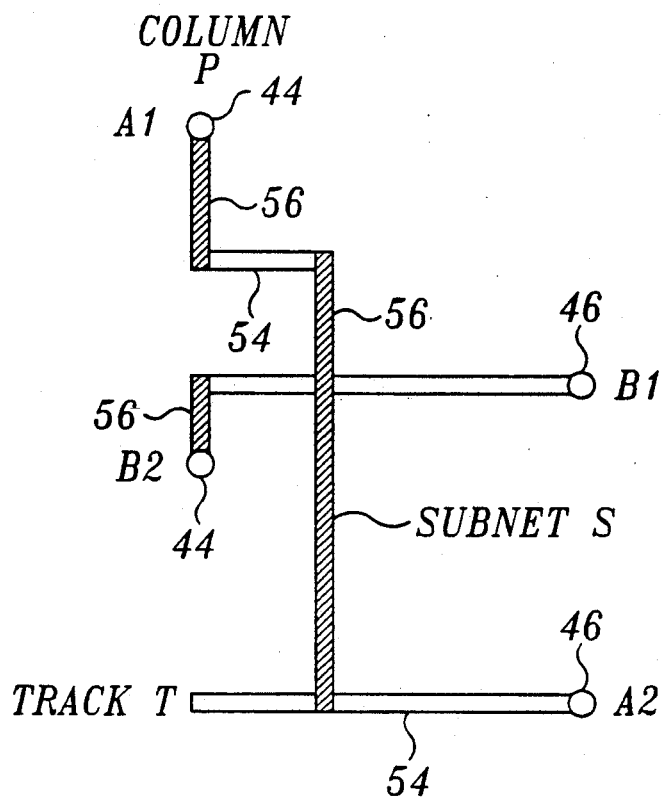
FIG. 6 is a schematic illustration of a "one jog" or "dogleg" interconnection of two pins comprising a subnet.
Figure 7:
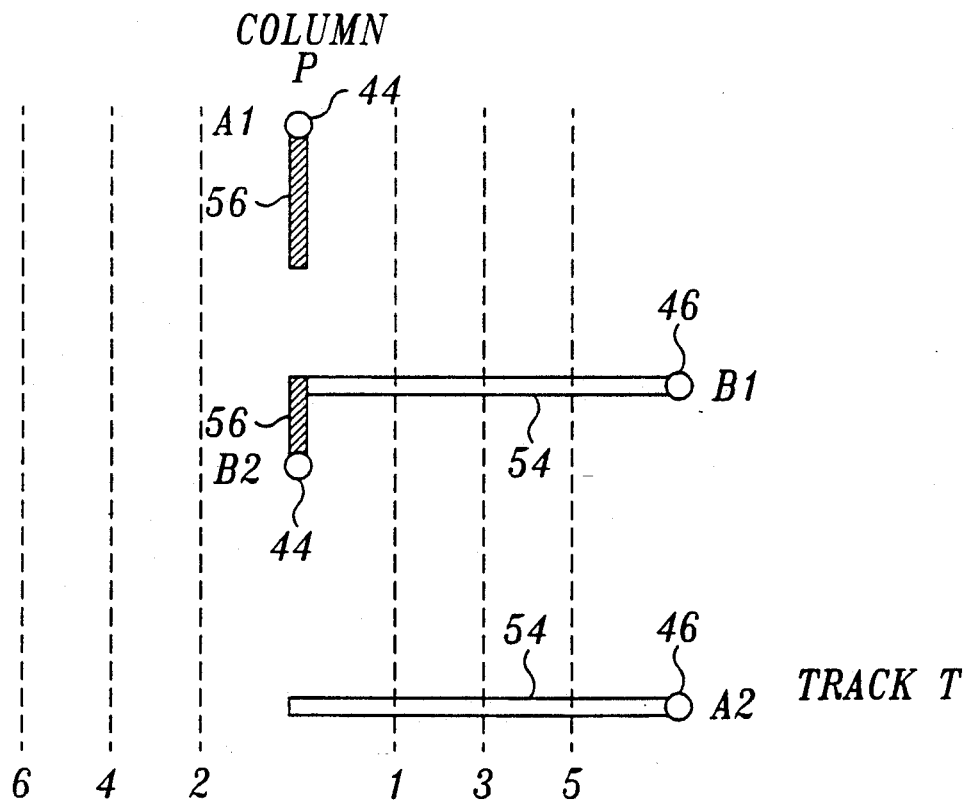
FIG. 7 schematically illustrates an alternating vertical track sequence, from left to right, used to determine an appropriate vertical column for interconnecting two horizontal tracks.

FIG. 6 merely presents an example illustrating how a single jog is used to connect the pins designated A1 and A2, thereby avoiding the connection between the internal pins designated B1 and B2. To select an appropriate path incorporating one jog, vertical tracks are preferably tried in alternating sequence from right to left, on each side of one of the pins to be connected using the one jog path. For example, as shown in FIG. 7, the path illustrated in FIG. 6 is developed by selecting a vertical track 1 as the first option for creating a one jog interconnection path between the pins designated A1 and A2. Assuming that another subnet belonging to a different net interfered with the use of vertical track 1, the next option would be a vertical track 2, followed by a vertical track 3. Using this alternating sequence for selecting the vertical track to make a one jog connection, the method ensures that the closest available vertical track is selected. Selecting the first available vertical track by sequentially trying vertical tracks in only one direction, either left or right of the pin in question, might result in a vertical track being selected that is much farther away from that pin than necessary.

Figure 9A:
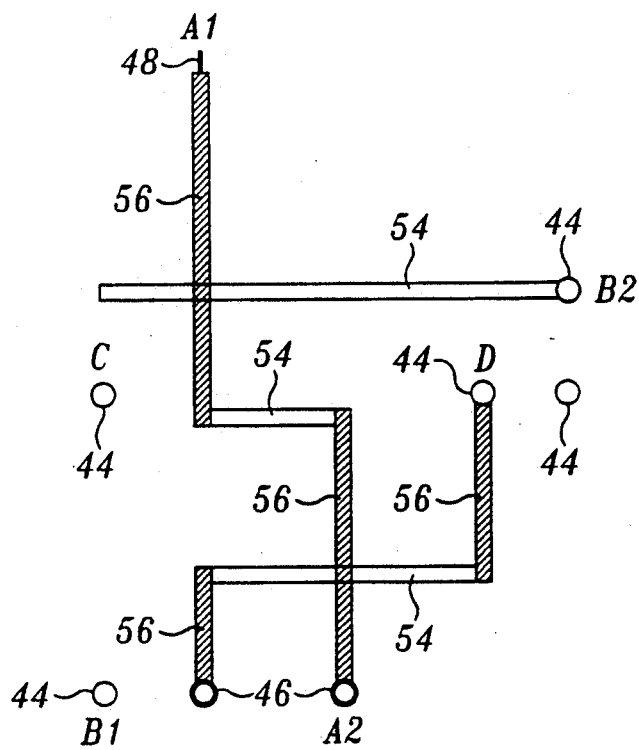
FIG. 9A schematically illustrates an initial interconnection of two pins that block interconnection of two other pins.
Figure 9B:
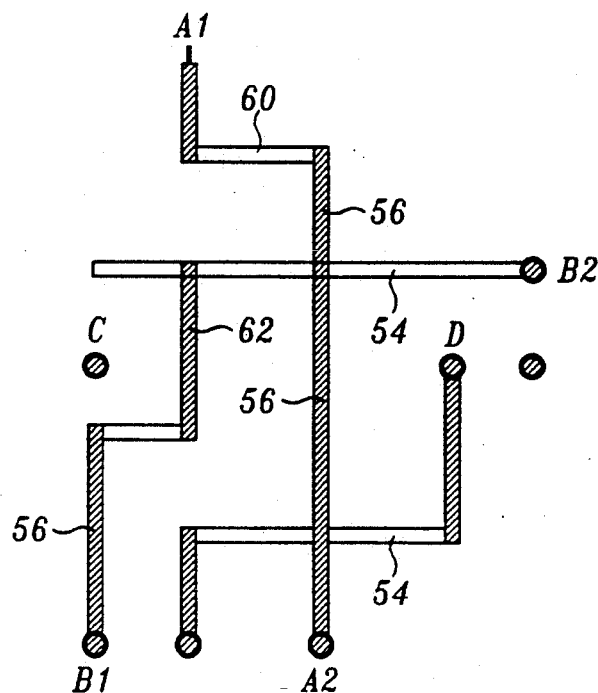
FIG. 9B shows how the initial interconnection of two pins in FIG. 9A is modified to permit interconnection of the two other pins in the Figure.

Accordingly, block 222 connects the boundary pin to the other pin in the subnet using the first available one jog. If a one jog path used to interconnect a top boundary pin with a bottom boundary pin includes a horizontal track that is generally close to tracks where internal pins are disposed, as shown in FIG. 9A, the horizontal track is shifted vertically so that it does not interfere with the internal pins. In FIG. 9A, top boundary pin 48, designated A1, is connected by a single jog path that includes a horizontal track 54'. However, horizontal track 54' interferes with the interconnection of two internal pins 44, designated B1 and B2. By shifting the horizontal interconnection vertically upward to a horizontal track 60, as shown in FIG. 9B, a vertical track segment 62 can be used for interconnecting pins B1 and B2 in combination with horizontal track 54, producing a usable single jog path.

Figure 8:
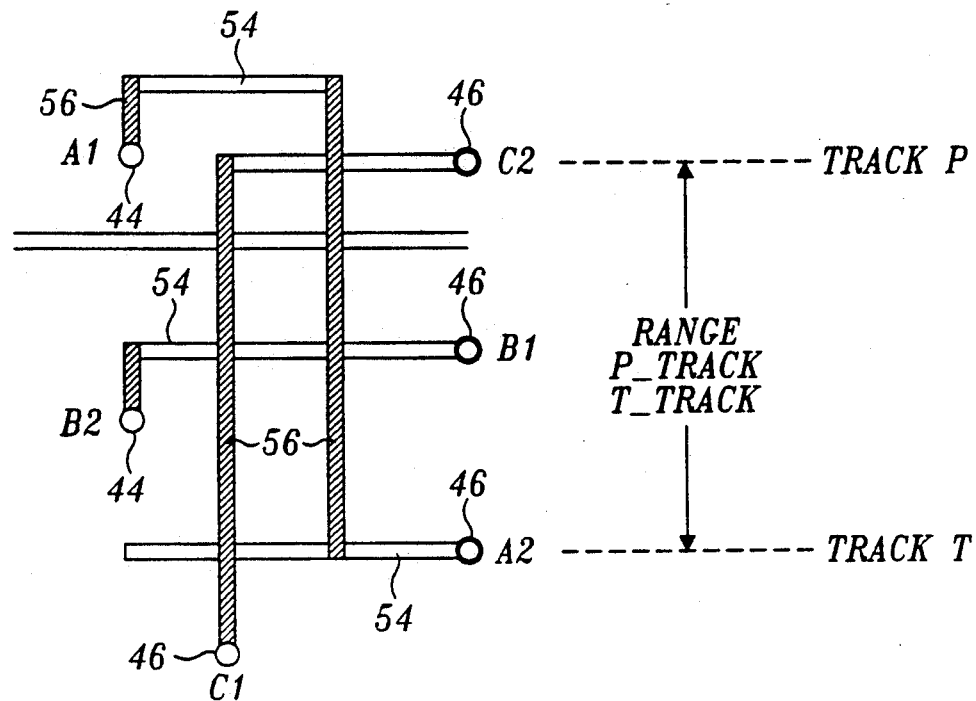
FIG. 8 schematically shows the use of horizontal tracks outside the range of two pins, for interconnection of the pins.

If the boundary pin cannot thus be connected, a block 224 connects the boundary pin to the other pin comprising its subnet using a different horizontal track and multiple jogs, as illustrated in FIG. 8. In this Figure, vertical pin 46, designated A2, is connected with internal pin 44 designated A1, using two vertical tracks 56 and two horizontal tracks 54, in a multiple jog path. It should be noted that the multiple jog path illustrated in this Figure extends outside a range P TRACK and thereby avoids interference with subnets C1, C2, and B1, B2. Following blocks 222 and 224 (or as a result of a negative determination in decision block 218), a decision block 226 determines whether any unconnected pins of subnets yet remain that can be connected with one jog. If so, block 228 provides for connecting the pins with one jog, substantially as shown in FIGS. 6 or 9B. Otherwise, a decision block 230 determines whether any unconnected pins of subnets can be connected with multiple jogs. If so, a block 232 connects those pins with multiple jogs, generally as represented in FIG. 8. Following block 232 (or as a result of a negative determination in decision block 230), a decision block 234 determines if any pins of subnets still remain unconnected. If so, a conventional maze router is used to connect those pins as provided in a block 236.

Those of ordinary skill in the art will appreciate that maze routing techniques are well known, and are readily implemented for connecting any remaining pins if such connections are generally possible. Interconnections made with the maze router tend to be much more complex and to use longer paths, compared to interconnections made according to the preceding steps in the method.

Should any pins still remain unconnected following use of the maze router, as determined in a decision block 238, a block 242 adds an additional horizontal track to center routing channel 40. After adding the additional horizontal track, the logic returns back to block 166 on FIG. 13A and repeats the succeeding steps already described above. On the other hand, if the result of the inquiry in decision block 238 is negative, indicating that all pins (i.e., subnets) have been properly connected, a block 240 returns from subroutine 130 to a decision block 316 in a main program 300, as shown in FIG. 12. As noted above, each successive horizontal channel is thus routed using the steps described for subroutine 130, until all horizontal routing channels have been completed. Following the logical rotation of multichip module 20, successive calls to the subroutine route subnets in the previous vertical channels, which are now treated as horizontal routing channels. Assignments of the boundary pins (i.e., vertical tracks through the boundary pins) to a particular subnet carried out during the initial routing of the horizontal channels (prior to the logical rotation of the multichip module), are temporary, since the previous boundary pins are now treated as vertical pins in the routing channel being processed following the logical rotation of the multichip module. After all subnets in the last channel are routed, all pins comprising subnets in multichip module 20 will have been assigned interconnecting tracks in a relatively efficient manner that makes maximum use of the area between pads 28 and boundaries 30 and 32 of ICs 22 for making the interconnections, thereby minimizing the size of the central routing channels between pads of adjacent ICs.

Figure 10:
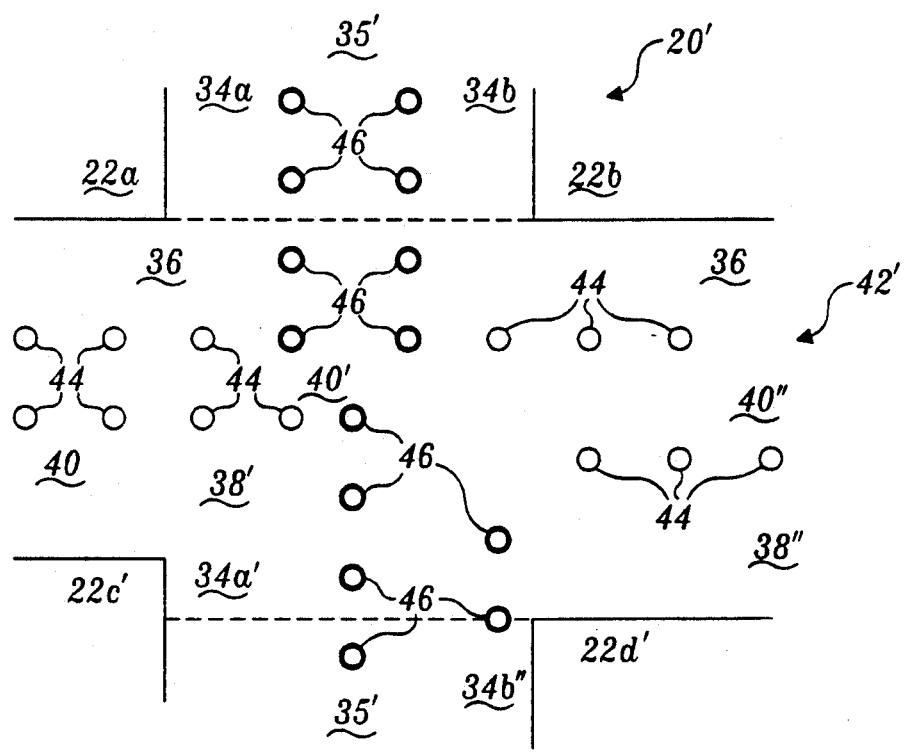
FIG. 10 is a schematic illustration of a portion of a multichip module in which the internal pins and vertical pins in a crossover area are nonaligned within the vertical and horizontal routing channel, due to nonalignment of the ICs comprising the multichip module.

The method for routing a multichip module can also be applied to interconnecting pins for ICs in a multichip module having unaligned boundaries and internal pins that are not aligned along horizontal and vertical tracks, generally as shown in FIG. 10 in respect to a multichip module 20'. Only a portion of multichip module 20' is shown that illustrates the asymmetrical distribution of ICs 22c' and 22d', in respect to ICs 22a and 22b. As a result of the lack of symmetry and alignment in positioning the ICs, a horizontal routing channel 42' includes a central routing channel 40', which includes a jog where it defines a crossover region in combination with a vertical routing channel 35'. To the right of the crossover region, a displaced central routing channel 40" is formed. Similarly, vertical routing channel 35' includes side routing channels 34a' and 34b' that are shifted to the right in respect to side channels 34a and 34b. However, the method used for routing interconnections is carried out in substantially the same fashion as explained above.

Figure 11B:
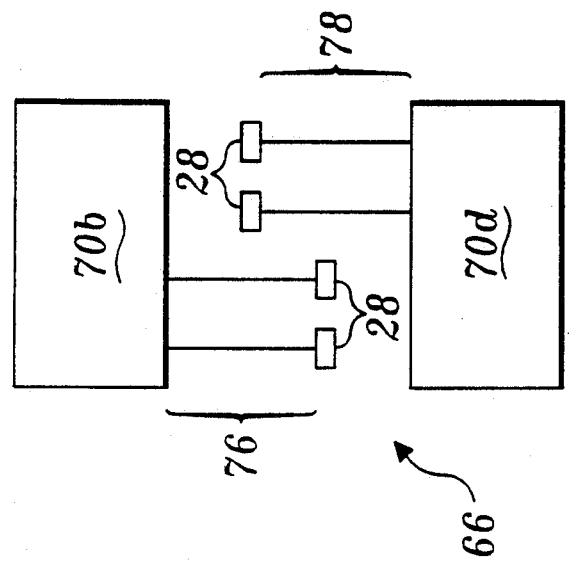
FIGS. 11A and 11B schematically show parts of a multichip module wherein ICs are mounted so that their top and bottom routing channels overlap.
Figure 11A:
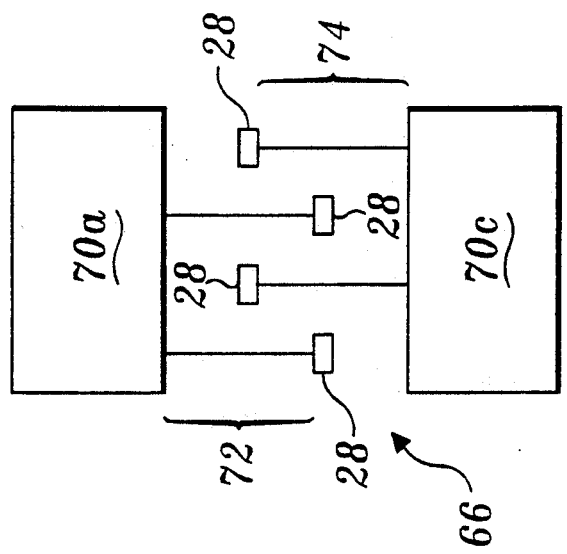

This method is also applicable to a multichip module 66, portions of which are shown in FIGS. 11A and 11B. In multichip module 66, ICs 70a and 70c are disposed adjacent each other and include pads 28, which generally overlap in the space between the ICs, to define a top routing channel 72, overlapping a bottom routing channel 74. In multichip module 66, there is no central routing channel between the pads of the adjacent ICs. Similarly, in FIG. 11B, instead of being interspersed in overlapping relationship, as shown clearly in FIG. 11A, pads 28 are configured in overlapping pairs, defining a top routing channel 76 between pads 28 and an associated IC 70b, and an overlapping bottom routing channel 78 between pads 28 and a corresponding IC 70d. Since in its broader form, the present invention does not specifically require a central routing channel, other than to provide additional tracks as indicated in block 242 (FIG. 13C), multichip module 66 can instead accommodate additional tracks as necessary by simply shifting the multichip modules further apart, so that the extent of overlap of top routing channel 72 and bottom routing channel 74, and of top routing channel 76 and bottom routing channel 78, is reduced.

Figure 14:
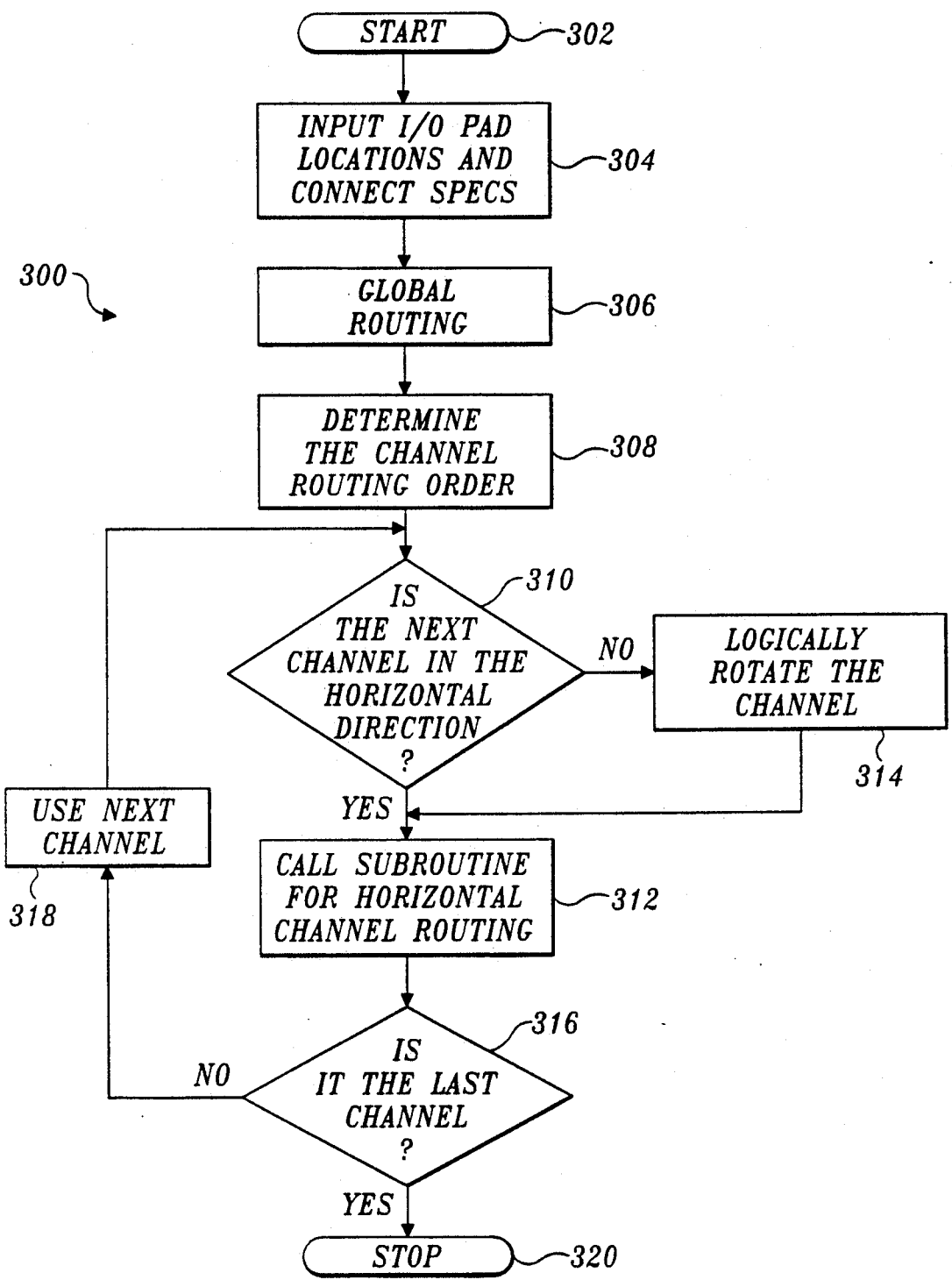
FIG. 14 is a flow chart of a program used in a second method of routing conductive traces to create a circuit board according to the present invention.
Figure 15:
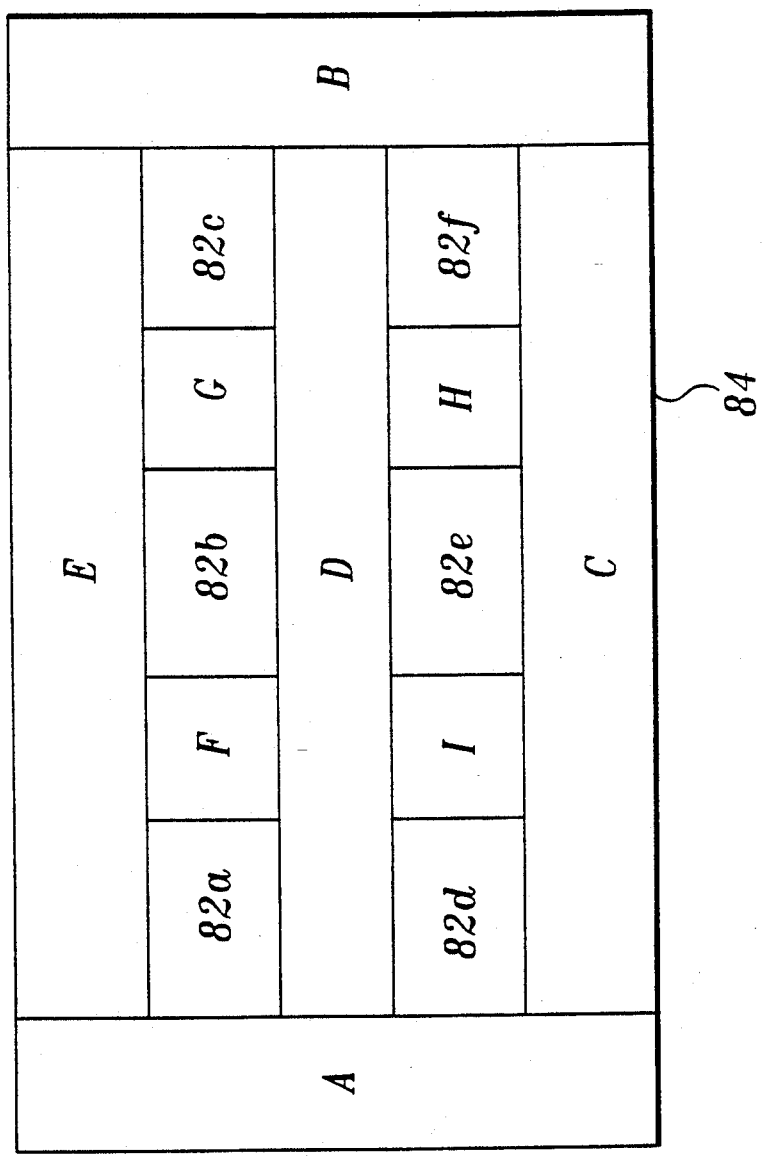
FIG. 15 is a schematic block diagram illustrating the division of a multichip module into contiguous sections for routing interconnections in accordance with the second method of routing conductive traces.

A further variation in the method for routing interconnections is defined by a main program 300, shown in the flow chart of FIG. 14. This embodiment begins with a start block 302 and, like the first method, includes a block 304 for providing data defining input/output pad locations and connection specifications for each of the pads associated with each of the ICs on the multichip module. Likewise, a global routing procedure in a block 306 is used to determine the vertical and horizontal channels through which specific pins are to be interconnected in nets of common electrical continuity. However, this method differs from the first routing method beginning in a block 308, wherein the routing order of the channels is defined for the multichip module. In this step, the vertical and horizontal channels are defined in respect to contiguous areas. Tracks assigned in these areas are not rerouted following logical orientation of the multichip module. For example, the division of a multichip module 80 into contiguous horizontal and vertical routing channel sections is provided in FIG. 15. A multichip module 80 is shown that includes six ICs, 82a-82f, mounted on a substrate 84. The pads and pins associated with each of the ICs are intentionally omitted from FIG. 15 in order to simplify the diagram. Generally, all of the space surrounding ICs 82 on substrate 84 is available for routing interconnections between pins that are in turn electrically connected to the internal circuitry of ICs 82 through pads 28 (not shown) as described above in respect to multichip module 20. Multichip module 80 is divided into a plurality of vertical and horizontal routing channels A through I, as shown in the Figure. The alphanumeric sequence of these routing channels does not necessarily reflect their routing order.

Referring back to FIG. 14, after the channel routing order has been determined in block 308, the program proceeds to a block 310 that determines if the next channel in the routing order priority is aligned in the horizontal direction. assuming that it is (which would not be the case for routing channel A), the subroutine for horizontal routing is called in a block 312. If the routing channel is not oriented in the horizontal direction, a block 314 logically rotates the channel, such that if it were previously vertical, e.g., as is routing channel A, it is now treated as a horizontal channel. Thereafter, the subroutine for horizontal channel routing is called in block 312. Following block 312, a decision block 316 determines if the last channel has been routed, and if not, proceeds to a block 318 which sets the next routing channel to be considered. After block 318, main routine 300 proceeds back through the loop, starting each time with decision block 310.

After the last channel has been routed, as determined by decision block 316, the main program stops at a block 320. Thus, the second method simply treats each section of multichip module 80 that is available for routing as a separate actual (or logically oriented) horizontal routing channel and proceeds to route interconnections in that section. After all of the channel sections have thus been routed by repetitively calling the subroutine, all pins in subnets on multichip module 80 are interconnected, making maximum use of all of the routing area between ICs 82. In this approach, boundary pin track assignments are not temporary, but instead are maintained as other adjacent routing channels are processed.

While the preferred embodiment of the invention has been illustrated and described, it will be appreciated that various changes can be made therein without departing from the spirit and scope of the invention. Accordingly, the scope of the invention is not to be limited by the above disclosure, but instead, should be determined entirely by reference to the claims.

The embodiments of the invention in which an exclusive property or privilege is claimed are defined as follows:

1. An electrical circuit comprising:
   a generally planar substrate;
   a plurality of integrated circuits mounted on the substrate, each integrated circuit having associated with it a plurality of bond pads to which the integrated circuit is electrically coupled, the bond pads being disposed at a distance from a perimeter of the integrated circuit and arranged in a spaced-apart array, thereby defining a side channel between the perimeter of the integrated circuit and the bond pads associated with it, and defining a central channel between the bond pads associated with that integrated circuit and the bond pads associated with an adjacent integrated circuit;
   a plurality of conductive traces formed on the substrate, for conducting electrical signals to and from the bond pads of the integrated circuits, wherein at least a portion of the conductive traces lie in said side channels adjacent the integrated circuits, and a portion of the conductive traces lie in the central channel between the bond pads associated with the adjacent integrated circuits.

2. The electrical circuit of claim 1, further comprising:
   a plurality of pins comprising electrical connection points between the bond pads and the conductive traces, said pins having a size smaller than that of a bond pad so that a pin is repositionable while continuing to maintain an electrical contact with one of the bond pads.

3. The electrical circuit of claim 1, wherein a pin in contact with a bond pad is contiguous with that bond pad and is positioned to align with and electrically connect to a selected conductive trace.

4. The electrical circuit of claim 1, wherein the conductive traces are photolithographic conductive traces.

5. The electrical circuit of claim 1, wherein a width of the central channel that lies between the bond pads of adjacent integrated circuits is minimized in order to increase the number of integrated circuits that are mounted on the substrate, by using the conductive traces disposed within the side channels to interconnect the bond pads so that fewer conductive traces within the central channel are used.

6. The electrical circuit of claim 1, wherein the integrated circuits are tape bonded integrated circuits.

7. The electrical circuit of claim 1, wherein each integrated circuit is mounted to the substrate by a plurality of fly wires that extend between the integrated circuit and its associated bond pads.

* * * * *

UNITED STATES PATENT AND TRADEMARK OFFICE
CERTIFICATE OF CORRECTION

PATENT NO. : 5,255,156
DATED : October 19, 1993
INVENTOR(S) : K.-C. Chang

It is certified that error appears in the above-indentified patent and that said Letters Patent is hereby corrected as shown below:

On title page, item

[75] "Inventor"     1     "Kou-Chaun Chang" should read --Kou-Chuan Chang--

Column   Line
12           23          "proceedsto" should read --proceeds to--

Signed and Sealed this

Sixteenth Day of May, 1995

Attest:

BRUCE LEHMAN

*Attesting Officer*        *Commissioner of Patents and Trademarks*